BELLOWS-LOADED THERMOELECTRIC MODULE

Filed May 9, 1966

INVENTOR
DOUGLAS G. HARVEY

BY Sughrue, Rothwell, Mion, Zinn & Macpeak
ATTORNEYS

United States Patent Office
3,539,399
Patented Nov. 10, 1970

3,539,399
BELLOWS-LOADED THERMOELECTRIC MODULE

Douglas G. Harvey, Baltimore, Md., assignor, by mesne assignments, to Teledyne, Inc., Los Angeles, Calif., a corporation of Delaware Filed May 9, 1966, Ser. No. 548,535
Int. Cl. H01v 1/04
U.S. Cl. 136—212 11 Claims

ABSTRACT OF THE DISCLOSURE

A thermoelectric conversion module is provided with bellows containing a fluid under pressure for applying a compressive force on the module to maintain the elements of the module in proper position.

This invention relates to a thermoelectric conversion module, and more particularly to an improved means for maintaining the thermoelectric elements in proper position under a compressive load. The development of the thermoelectric generator as a static energy conversion device is due in part to the use of semiconductor thermoelectric materials exhibiting high thermoelectric power conversion efficiency, low electrical resistivity and low thermal conductivity. The use of the semiconductor materials are however not without adverse effects, since in general they are extremely fragile and tend to oxidize and sublimate at relatively high temperatures. Due to their fragile nature, there is always the problem of disintegration or cracking as a result of compressional or bending loads due to resultant thermal expansion under load, or as a result of assembly fabrication. Electric generator assemblies commonly consist of an appropriate heat source in contact with a series of thermoelectric couples held between a hot plate adjacent the heat source and a cold sink plate. The thermoelectric couples acting as the thermal-to-electrical conversion means may be fabricated in the form of a module to facilitate ease in assembly and in component replacement. During assembly of the module, it is desirable to allow sufficient angular and lateral tolerances in the placement of the thermoelectric couples to permit ease of fabrication. Since the module is subjected to relatively high temperatures, allowance must be made for thermal expansion without placing undue bending or compressive loads on the thermoelectric elements. During operation, it is desirable to maintain a uniform but controlled compressive load on the thermoelectric element to reduce electro-element contact resistance, and to decrease the probability of power degradation over a period of time, since there is some thermal cracking and sublimation during extended use. Further, the controlled compressive load maintains good thermal efficiency between the hot junction side and the cold junction side of the conversion module. Since the semiconductor thermoelectric element materials are highly subject to poisoning, it is generally necessary to hermetically seal the module, and generally to fill the module cavity with an inert gas.

In the past, thermoelectric generators have incorporated several hundred thermoelectric elements or couples in either flat pancake form or as a cylindrical array about a suitable source of thermal energy, for instance, a radioisotopic heat source. Due to the fragile nature of the thermoelectric elements forming the individual couple, it is necessary to accurately position each element and to individually apply a compressive force longitudinally of each element. To ensure proper compressive loading, without the detrimental effects of an applied bending load to the element which hastens element deterioration during use, thermoelectric generator modules in the past have employed tubular guides or other cylindrical means which receive each thermoelectric element of the module array for restraining lateral movement while incorporating therewith a highly complicated and expensive compressive force applying member at the cold shoe end of each thermoelectric element. One specific form employs a button having a semispherical face received within a cooperating semispherical recess formed in an adjacent metal shank to produce a ball and socket type of connection. It is true that such a device in combination with a longitudinal compressive stress applying member ensures that the compressive stress is applied to the thermoelectric elements in such a manner as to minimize any bending moment in the thermoelectric elements and while permitting some relative movement of the parts during heating up and cooling down of the module assembly. While this type of ball and socket connection further ensures adequate heat transfer between the thermal elements and the force applying member, the specific arrangement requires a relatively large number of machined parts with close tolerances and at an unnecessarily high expense.

It is, therefore, a primary object of this invention to provide an improved thermoelectric module which allows controlled, compressive loads to be placed individually on the thermoelectric element without placing undue bending or compressive loads at minimum expense while permitting maximum ease of fabrication.

It is a further object of this invention to provide an improved thermoelectric module assembly of this type which eliminates the requirements for close tolerances on either the thermoelectric elements forming the conversion means or the compressive force applying members.

It is a further object of this invention to provide an improved thermoelectric module assembly of this type which allows unrestrained lateral movement between the force applying members and the thermoelement during thermal loading and unloading of the assembly.

It is a further object of this invention to provide an improved thermoelectric module of this type in which the compressive loading on the thermoelectric element may be easily and cheaply achieved for module configurations in either planar or cylindrical form.

Further objects of this invention will be pointed out in the following detailed description and claims and illustrated in the accompanying drawing which discloses, by way of example, the principle of this invention and the best modes which have been contemplated of applying that principle.

Figure 1:
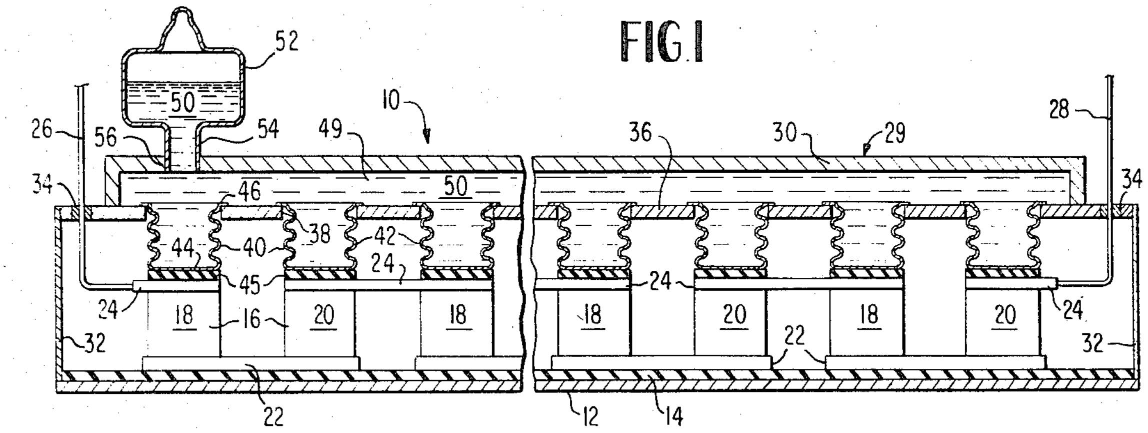
FIG. 1 is an elevational view, in section, of one embodiment of the present invention.
Figure 4:
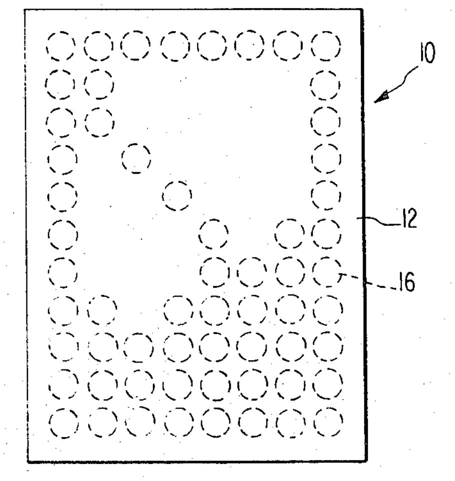
FIG. 4 is a bottom plan view of the embodiment shown in FIG. 1.
Figure 5:
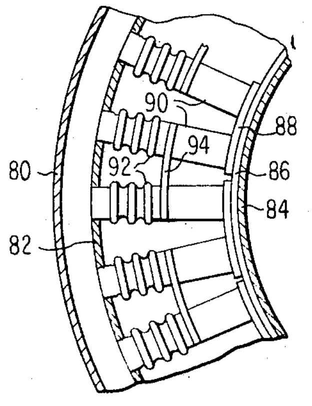
FIG. 5 is an end, sectional view of a thermoelectric module forming yet a fourth embodiment of the present invention.

Referring to FIGS. 1 and 4 of the drawing, one embodiment of the present invention comprises a thermoelectric conversion module 10 of rectangular, pancake configuration. The conversion module 10 incorporates a bottom metal plate 12 which is placed directly in contact with an appropriate source (not shown) of thermal energy, such as a radioisotopic heat source. The inner surface of plate 12 is lined with an insulating strip 14 which electrically insulates the thermoelectric couples 16 from the conductive metal plate 12. The thermoelectric couples 16 are conventionally formed of a pair of dissimilar thermoelectric elements, such as an N type element 18 and a P type element 20, spaced slightly from each other and brazed or pressure contacted to a heat conductive metal plate 22 acting as the hot thermal junction. Thermoelectric elements 18 and 20 may be of any suitable thermoelectric material. Suitably doped lead telluride alloys may provide the basic semiconductor thermoelectric materials for elements 18 and 20.

On the cold junction side of the thermal elements, appropriate cold shoes 24 are bonded or pressure contacted to the thermal elements, the cold shoe elements 24 acting in conjunction with the hot theremojunction plates 22 to form an appropriate electrical series circuit which extends from one end to the other of the module assembly. Appropriately, electrical leads 26 and 28 extend exteriorly of the module assembly at the left and right-hand ends of the module for connection to external loads. The module is completely enclosed within a metal casing or housing. A cold sink assembly 29 includes metal plate 30, coupled to the hot plate 12 by side walls 32 which may be also formed of metal, either rigid or flexible as desired. For instance, the side walls 32 may be bellows-like to allow for some axial expansion and contraction between the cold and hot plates 30 and 12, respectively. The electrical leads 26 and 28 are insulated from the cold plate 30 by appropriate insulating gaskets 34 at the points where the leads pass exteriorly of the module assembly. In addition to the plate 30, the cold sink assembly further includes a perforated second plate 36 which also may be formed of metal, which is rigidly coupled to the cold plate 30 by welding or soldering, etc.

Holes or perforations 38 are aligned axially with respective thermoelectric elements 18 and 20 so as to overlie the same.

The present invention is directed to the compressive force applying means for maintaining proper positioning of the thermoelectric elements. The thermoelectric elements 18 and 19 are maintained in compression while allowing for thermal expansion of the elements making up the assembly and without placing undue bending forces upon the elements. In this respect, each of the openings 38 is provided with a compressive force applying bellows 40 having an undulating side wall 42, a flat contact face 44 and an annular rim 46 which is of a diameter in excess of opening 38. Means are provided for rigidly coupling the rim 46 to the outer surface of plate 36 adjacent the opening 38, such as by welding, brazing or soldering. Bellows 40 which is preferably formed of metal or other gas tight material, acts as the compressive force applying means for the axially positioned elements. In order to electrically isolate the thermoelectric cold shoe junction plates 24 from the module housing, thin strips 45 of electrical insulating material are positioned between the contact face 44 of the bellows member and the exposed surface of the thermoelectric cold shoe plate 24.

While bellows 40 may inherently place some compressive force upon the thermoelectric element associated therewith during assembly by utilizing sidewalls 42 which are springlike, it is preferable to provide some other means of applying the desired compressive force on the thermal elements using the bellows as the intermediary. In the embodiment shown in FIG. 1, a liquid 50 fills the cavity between the plates 30 and 36, as well as the interior of each of the bellows 40. There is shown schematically a source of liquid in the form of reservoir 52 which has a tubular section 54 received within an opening 56 formed within the outer plate 30. Obviously, if the reservoir container 52 is flexible, compressing the reservoir side wall by any means will act to force the liquid into the chamber 49 increasing the compressive force supplied by each bellows 40 on its associated thermoelement. Likewise the container 52 may be rigid and the upper portion of the chamber filled with a compressible gas to vary the pressure of the liquid on the bellows. Obviously, as a result of the difference in thermal expansion coefficients between the various materials making up the assembly, there may be a tendency for the thermoelectric element or couple to shift laterally. The convoluted side wall 42 will, of course, place no restraint upon lateral shifting of the thermoelectric element and will actually allow shifting of the flattened face 44 along with the thermoelement 18 or 20 without in any way affecting the axial compressive loading of the thermoelectric element at the desired pressure level. The bellows 40, being flexible, therefore allows for angular and lateral misalignment of the thermoelectric element and the associated module member, while permitting free thermal expansion and contraction of these elements during thermal loading and unloading.

Figure 2:
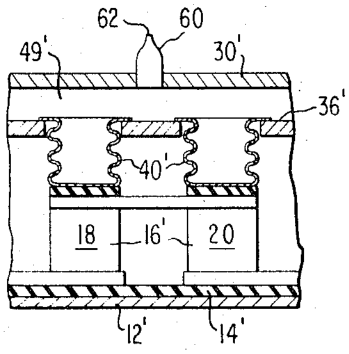
FIG. 2 is a partial elevational view, in section, of a second embodiment of the present invention.

Reference to FIG. 2 shows portion of the second thermoelectric conversion module in the form of an alternate embodiment to the present invention. In this case, the hot junction plate 12′ of metal is separated from the thermoelectric couple 16′ by an electrical insulation sheet 14′, such as mica, while the metal plate members 30′ and 36′ at the cold junction side of the assembly form a fluid reception cavity 49′ in the same manner as the previous embodiment. Again, metal bellows members 40′ allow axial compressive loading of the thermoelectric couples 16′. However, instead of using a liquid as the compressive force supplying means, compressed gas is delivered through an appropriate tube 60 (which is shown pinched off at 62) to the cavity 49′ which is in fluid communication with the interior of each of the bellows 40′.

As with the previous embodiment using liquid in the chamber 49 the compressed gas in the chamber 49′ will act equally to increase the compressive force supplied by each bellows 40′ on its associated thermoelement. Once again, the bellows arrangement will allow lateral shifting of the thermoelectric element or couple without in any way affecting the axial compressive loading of the thermoelectric element at the desired pressure and level.

Figure 3:
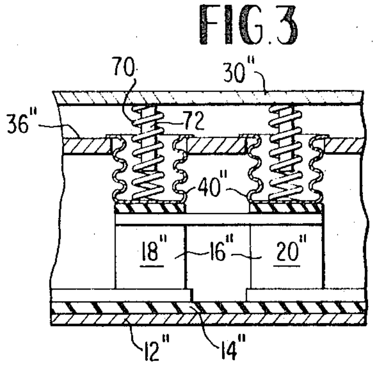
FIG. 3 is an elevational view, in section, of a portion of a thermoelectric conversion module forming a third embodiment of the present invention.

FIG. 3 shows another embodiment of the invention wherein the thermoelectric elements 16″ are mounted in the same general arrangement as the previous embodiments within a chamber formed by the cold plates 30″, 36″, and hot plate 12″. The bellows 40″ are secured to the openings in the cold plate 36″ and receive a spring member 70 in each of the bellows. The coil spring 70 is compressed between the cold plate 30″ and the bottom surface of the bellows 40″ to apply a compressive force to the thermoelectric element. The coil spring 70 is guided by means of a pin 72 extending downwardly through the spring 70 and attached to the inner surface of the cold plate 30″. Once again, it is seen that the bellows 40″ allow for lateral shifting of the thermoelectric element or couple while in no way affecting the axial compressive loading of the thermoelectric element by the desired spring pressure.

As previously mentioned, a plurality of the thermoelectric modules may be placed between a pair of parallel plates as shown in the embodiment of FIG. 4. It is also contemplated within the scope of the present invention to arrange the thermoelectric modules in a radial or cylindrical manner. To accomplish this, a cylindrical hot plate 84 would be provided in which the appropriate heat source would be located. A concentric cylindrical cold plate 80 of larger diameter than the hot plate 84 would surround the hot plate 84 in spaced relation thereto. The outer surface of the hot plate 84 would be provided with an electrical insulating strip 86 against which the curved heat conductive metal plate 88 would be located. A pair of thermoelectric elements 90 would be mounted on the plate 88 and extend outwardly therefrom in a radial manner. A second cold plate 82 of cylindrical form is located inwardly and spaced from the cylindrical cold plate 80. A plurality of bellows 92 similar to the bellows 40 are secured to openings in the cold plate 82 and the inner end of the bellows bear against appropriate cold shoes 94 which in turn bear against the outer ends of the thermoelectric elements 90. The chamber defined between the cold plates 80 and 82 may be filled with an appropriate liquid or gas in the manner shown in the embodiments of FIGS. 1 and 2. Likewise, coil springs may be utilized to increase the compressive force of the bellows members in the manner shown in the embodiment shown in FIG. 3.

In those embodiments of the present invention which rely upon fluid pressure as the compressive force addition means, it is most desirable to maintain a good thermal conductive path between the cold shoe side of the thermoelectric elements and the outer plate 30 of the heat sink assembly. For instance, in FIG. 1 the fluid 50 most advantageously may comprise a liquid metal, such as a sodium potassium eutectic. In the embodiment of FIG. 2 wherein a pressurized gas acts as the compressive fluid, most gases under pressure will provide the desired thermal transfer function. For instance, pressurized nitrogen or helium may be employed within cavity 49' for this purpose. The above conductive fluids are merely examples of an appropriate pressurized liquid or gas suitable for the purposes of this invention, but it is not intended that the invention be limited thereto.

It is contemplated that numerous other arrangements of the thermoelectric elements could be provided or utilized in the features of the present invention. Obviously, many modifications and variations of the present invention are possible in the light of the above teachings. It is, therefore, to be understood that within the scope of the appended claims, the invention may be practiced otherwise than as specifically described.

What is claimed is:

1. A thermoelectric system comprising a pair of heat conductive members, thermoelectric means intermediate said heat conductive members and means for maintaining said members and said thermoelectric means under compression including support means fixed relative to one of said members, bellows means comprising at least two individual bellows with said bellows secured to said support means at one end with their other ends exerting a compressive force against the other of said members, and fluid under pressure within said bellows means for applying a compressive force on said thermoelectric means.

2. A thermoelectric system according to claim 1 wherein said support means includes a hollow chamber and wherein said bellows means are secured to the chamber at one end thereof with the interior portion of the bellows means being in fluid communication with the interior of said chamber and with the opposite end of said bellows means being closed.

3. A thermoelectric system according to claim 2 wherein a plurality of thermoelectric means are each provided with a bellows means in fluid communication with said chamber.

4. A thermoelectric system according to claim 3 wherein said chamber and said bellows means are filled with a fluid under pressure.

5. A thermoelectric system according to claim 4 wherein said fluid is a liquid.

6. A thermoelectric system according to claim 5 wherein said fluid is a liquid of high thermal conductivity.

7. A thermoelectric system according to claim 4 wherein said fluid is a gas.

8. A thermoelectric system according to claim 3 wherein said plurality of thermoelectric elements are electrically coupled together in series.

9. A thermoelectric system according to claim 3 wherein said plurality of thermoelectric elements are disposed between two parallel plates.

10. A thermoelectric system according to claim 3 wherein said plurality of thermoelectric elements are radially disposed between two concentric cylindrical plate members.

11. A thermoelectric system according to claim 1 wherein said thermoelectric means are enclosed in an inert gas environment.

References Cited

UNITED STATES PATENTS

| | | | |
|---|---|---|---|
| 235,966 | 12/1880 | Sammons. | |
| 3,075,030 | 1/1963 | Elm et al. | 136—208 |
| 3,129,116 | 4/1964 | Corry | 136—208 |
| 3,208,877 | 9/1965 | Merry | 136—212 X |
| 3,266,944 | 8/1966 | Spira et al. | 136—230 X |
| 3,269,875 | 8/1966 | White | 136—212 |
| 3,325,312 | 6/1967 | Sonntag | 136—212 |
| 3,377,206 | 4/1968 | Hanlein et al. | 136—212 |
| 3,411,955 | 11/1968 | Weiss | 136—205 |

FOREIGN PATENTS

| | | |
|---|---|---|
| 14,904 | 1899 | Great Britain. |

ALLEN B. CURTIS, Primary Examiner

U.S. Cl. X.R.

100—269